(12) United States Patent
Park et al.

(10) Patent No.: US 8,872,181 B2
(45) Date of Patent: Oct. 28, 2014

(54) THIN FILM TRANSISTOR ARRAY SUBSTRATE AND METHOD OF MANUFACTURING THE SAME

(75) Inventors: Jong-Hyun Park, Yongin (KR); Joon-Hoo Choi, Yongin (KR); Seong-Kweon Heo, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 225 days.

(21) Appl. No.: 13/415,984

(22) Filed: Mar. 9, 2012

(65) Prior Publication Data
US 2013/0048990 A1    Feb. 28, 2013

(30) Foreign Application Priority Data

Aug. 29, 2011    (KR) .................. 10-2011-0086563

(51) Int. Cl.
| H01L 27/07 | (2006.01) |
| H01L 21/00 | (2006.01) |
| H01L 27/12 | (2006.01) |
| H01L 27/32 | (2006.01) |

(52) U.S. Cl.
CPC ........ *H01L 27/3276* (2013.01); *H01L 27/1255* (2013.01); *H01L 27/1259* (2013.01); *H01L 27/124* (2013.01)
USPC .............................................. 257/59; 438/34

(58) Field of Classification Search
USPC .......................... 257/59, 72, E33.053; 438/34
See application file for complete search history.

(56) References Cited

U.S. PATENT DOCUMENTS

| 7,842,953 | B2* | 11/2010 | Ku ................................. 257/59 |
| 7,884,364 | B2* | 2/2011 | Kim et al. ...................... 257/59 |
| 8,357,936 | B2* | 1/2013 | Choi et al. ..................... 257/59 |
| 2008/0135857 | A1 | 6/2008 | Kim et al. |
| 2009/0322978 | A1 | 12/2009 | Peng |
| 2010/0015876 | A1 | 1/2010 | Kang et al. |

FOREIGN PATENT DOCUMENTS

| KR | 10-2001-0057022 A | 7/2001 |
| KR | 10-2008-0026277 A | 3/2008 |
| KR | 10-2008-0054338 | 6/2008 |
| KR | 10-2010-0002154 | 1/2010 |
| KR | 10-2010-0009808 | 1/2010 |

\* cited by examiner

*Primary Examiner* — Fernando L Toledo
*Assistant Examiner* — Neil Prasad
(74) *Attorney, Agent, or Firm* — Lee & Morse, P.C.

(57) ABSTRACT

A substrate includes an active layer, a gate electrode, source and drain electrodes, first and second insulating layers, a first line and a second line on a same layer as the gate electrode, the first line and the second line include a same material as the gate electrode and are aligned in a first direction, a third line crosses the first line, the third line is on a same layer as the source and drain electrodes, includes a same material as the source and drain electrodes, and is aligned in a second direction, a repair line on a same layer as the active layer, the repair line includes a same material as the active layer, a pixel electrode in the pixel region, and the pixel electrode is on a same layer as a lower electrode of the gate electrode and includes a same material as the lower electrode.

20 Claims, 14 Drawing Sheets

THIN FILM TRANSISTOR ARRAY SUBSTRATE AND METHOD OF MANUFACTURING THE SAME

CROSS-REFERENCE TO RELATED PATENT APPLICATION

This application claims the benefit of Korean Patent Application No. 10-2011-0086563, filed on Aug. 29, 2011, in the Korean Intellectual Property Office, the disclosure of which is incorporated herein in its entirety by reference.

BACKGROUND

A flat panel display device, such as an organic light-emitting display device and a liquid crystal display device, may include a thin film transistor (TFT), a capacitor, and wires connecting the thin film transistor and the capacitor.

SUMMARY

Embodiments may be realized by providing a thin film transistor array substrate including a thin film transistor that is disposed in a pixel region formed on a substrate and includes an active layer, a gate electrode including a lower electrode and an upper electrode, source and drain electrodes, a first insulating layer interposed between the active layer and the gate electrode, and a second insulating layer interposed between the gate electrode and the source and drain electrodes; a first line and a second line which are formed on the same layer as the gate electrode using the same material as the gate electrode and aligned in a first direction; a third line that crosses the first line to define a pixel region, is formed on the same layer as the source and drain electrodes using the same material as the source and drain electrodes, and aligned in a second direction; a repair line that is formed on the same layer as the active layer using the same material as the active layer; and a pixel electrode that is disposed in the pixel region and is formed on the same layer as the lower electrode using the same material as the lower electrode.

The repair line may be aligned in the first direction and may have at least one crossing point with the third line.

The repair line may be a plurality of repair lines, at least one of which is disposed at a first side of the first line in the pixel region and at least one of which is disposed at a second side, opposite to the first side, of the second line in the pixel region.

The repair line may be aligned in the second direction and may have at least one crossing point with the first line and the second line.

The third line may be a plurality of third lines, and each of which is electrically coupled to a first pixel, a second pixel, or a third pixel, and the repair line is a plurality of repair lines, each of which is respectively aligned at one side of each of the third lines substantially parallel to the third lines so as to cross adjacent two pixel regions.

The repair line may include a first repair line that is aligned in the first direction and has at least one crossing point with the third line, and a second repair line that is aligned in the second direction and has at least one crossing point with the first and second line. The first repair line and the second repair line may cross each other.

The first repair line may be a plurality of first repair lines, at least one of which is disposed at a first side of the first line in the pixel region and at least one of which is disposed at a second side, opposite to the first side, of the second line in the pixel region.

The third line may be a plurality of third lines, and each of which is electrically coupled to a first pixel, a second pixel, or a third pixel, and the repair line may be a plurality of repair lines, each of which is respectively aligned at one side of each of the third lines substantially parallel to the third lines so as to cross adjacent two pixel regions.

The active layer and the repair line may include a semiconductor material.

The lower electrode and the pixel electrode may include a transparent conductive oxide (TCO).

The transparent conductive oxide may include at least one of indium tin oxide (ITO), indium zinc oxide (IZO), zinc oxide (ZnO), indium oxide ($In_2O_3$), indium gallium oxide (IGO), and aluminum zinc oxide (AZO).

Embodiments may also be realized by providing a method of manufacturing a thin film transistor array substrate, the method including a first mask process including forming a semiconductor layer on a substrate and patterning the semiconductor layer to form an active layer of a thin film transistor and a repair line; a second mask process including forming a first insulating layer, sequentially stacking a first conductive layer and a second conductive layer on the first insulating layer, and simultaneously patterning the first conductive layer and second conductive layer to form a gate electrode of the thin film transistor, a scan line, a power source line, and a pixel electrode pattern; a third mask process including forming a second insulating layer and forming an opening such that the second insulating layer exposes source and drain regions of the active layer and the pixel electrode pattern; and a fourth mask process including forming a third conductive layer on the resultant structure of the third mask process and patterning the third conductive layer to form source and drain electrodes of the thin film transistor, a data line and a pixel electrode.

Ion impurities may be doped on the source and drain regions after performing the second mask process.

The repair line may be aligned in a first direction and may have at least one crossing point with the data line.

The repair line may be a plurality of repair lines, at least one of which is disposed at a first side of the scan line in the pixel region and at least one of which is disposed at a second side, opposite to the first side, of the power source line in the pixel region.

The repair line may be aligned in a second direction and may have at least one crossing point with the scan line and the power source line.

The data line may include a first data line electrically coupled to a first pixel, a second data line electrically coupled to a second pixel, and a third data line electrically coupled to a third pixel. The repair line may be one of a plurality of repair lines, each of which is respectively aligned at one side of each of the data lines substantially parallel to the data lines so as to cross adjacent two pixel regions.

The repair line may include a first repair line that is aligned in the first direction and has at least one crossing point with the data line, and a second repair line that is aligned in the second direction and has at least one crossing point with the scan line and the power source line. The first repair line and the second repair line may cross each other.

The first repair line may be a plurality of first repair lines, at least one of which is disposed at a first side of the scan line in the pixel region and at least one of which is disposed at a second side, opposite to the first side, of the power source line in the pixel region.

The data line may include a first data line electrically coupled to a first pixel, a second data line electrically coupled to a second pixel, and a third data line electrically coupled to a third pixel. The second repair line may be one of a plurality of second repair lines, each of which is respectively aligned at one side of each of the data lines substantially parallel to the data lines so as to cross adjacent two pixel regions.

BRIEF DESCRIPTION OF THE DRAWINGS

Features will become apparent by describing in detail exemplary embodiments thereof with reference to the attached drawings in which.

DETAILED DESCRIPTION

Figure 1:
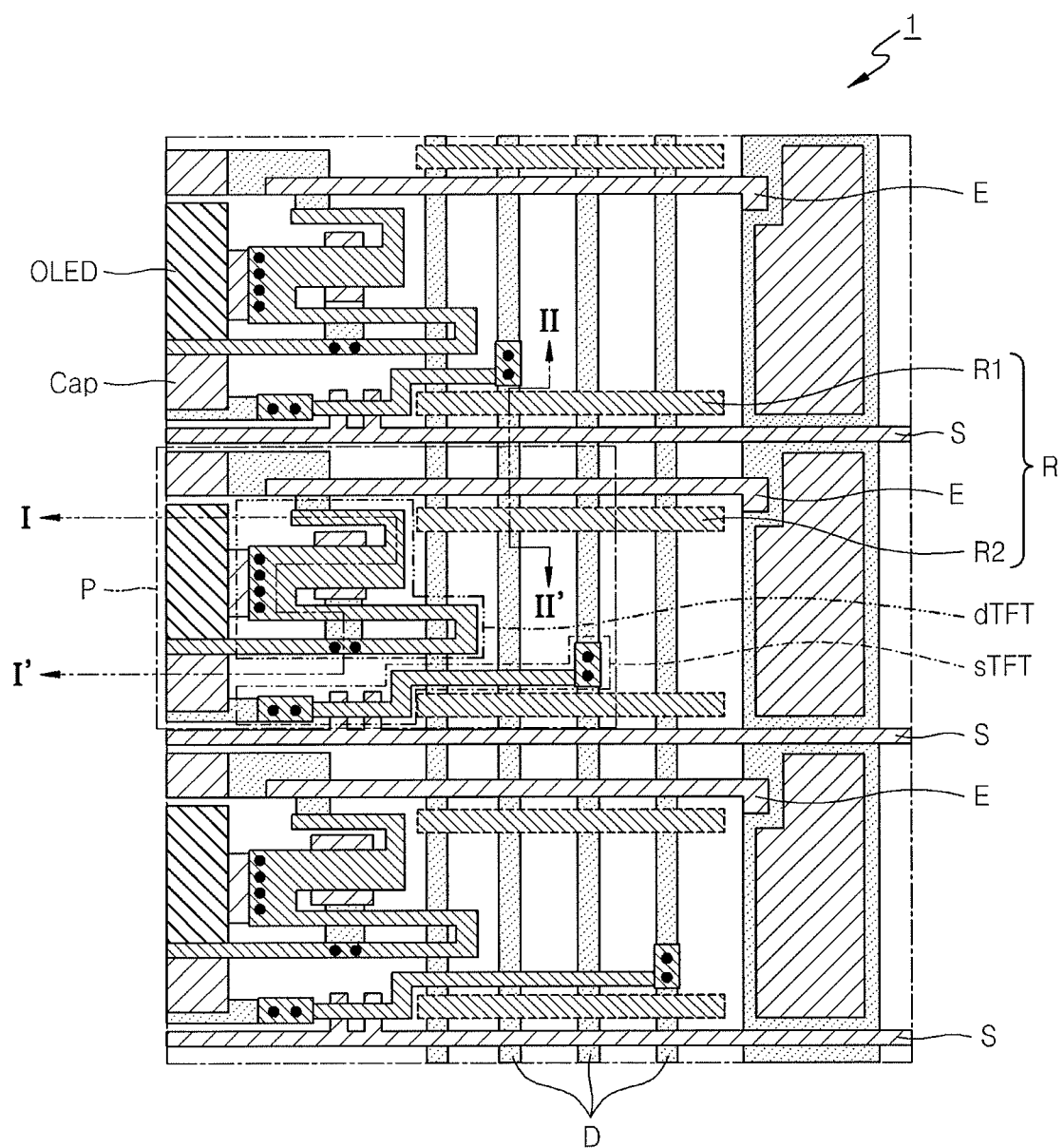
FIG. 1 illustrates a schematic bottom view of a thin film transistor array substrate, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. This is not intended to limit the embodiments to particular modes of practice, and it is to be appreciated that all changes, equivalents, and substitutes that do not depart from the spirit and technical scope are encompassed in the embodiments. In the description, certain detailed explanations of related art are omitted when it is deemed that they may unnecessarily obscure the essence of the embodiments.

While such terms as "first," "second," etc., may be used to describe various components, such components must not be limited to the above terms. The above terms are used only to distinguish one component from another. The terms used in the present specification are merely used to describe particular embodiments, and are not intended to limit the embodiments. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

As used herein, the term "and/or" includes any and all combinations of one or more of the associated listed items. Expressions such as "at least one of," when preceding a list of elements, modify the entire list of elements and do not modify the individual elements of the list.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will also be understood that when a layer is referred to as being "between" two layers, it can be the only layer between the two layers, or one or more intervening layers may also be present. Like reference numerals refer to like elements throughout.

Figure 2:
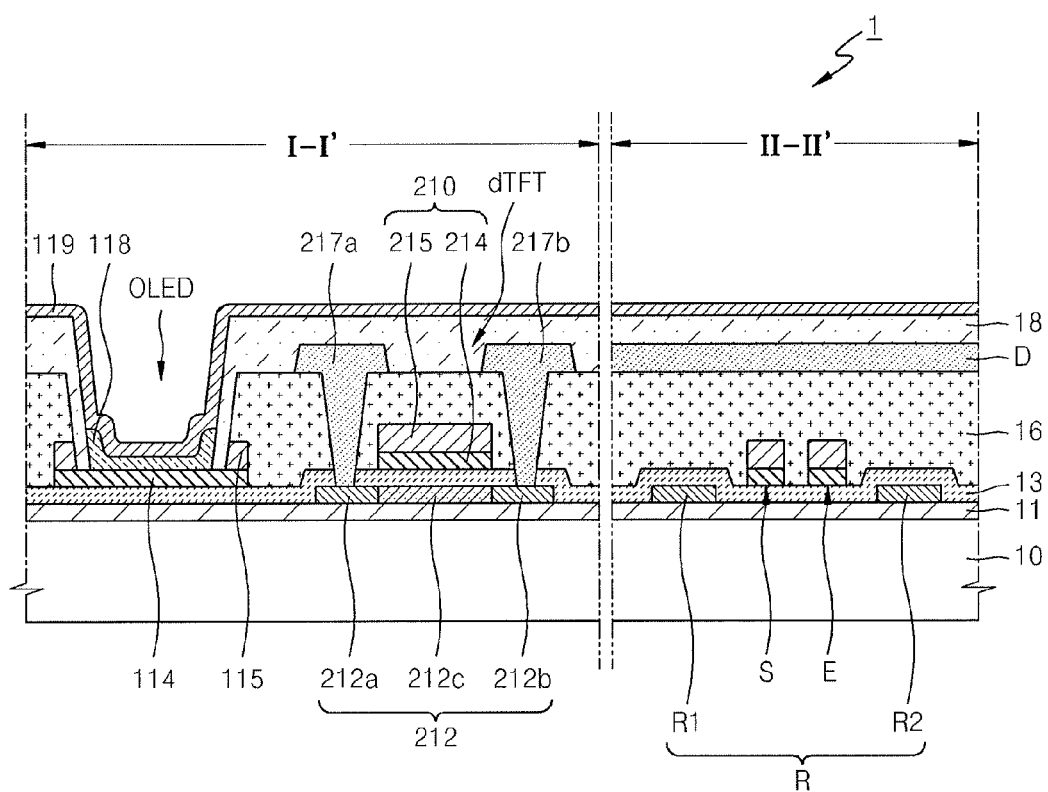
FIG. 2 illustrates a cross-sectional view taken along lines I-I' and II-II' of FIG. 1.

FIG. 1 illustrates a schematic bottom view of a thin film transistor array substrate 1 according to an exemplary embodiment. FIG. 2 illustrates a cross-sectional view taken along lines I-I' and II-II' of FIG. 1. That is, FIG. 1 illustrates the bottom surface of the substrate through which devices formed on the front surface of the substrate are shown.

FIGS. 1 and 2 show the thin film transistor array substrate 1 installed in an organic light-emitting display device. However, embodiments are not limited thereto. For example, if the thin film transistor array substrate 1 includes a liquid crystal display device instead of an organic light-emitting device OLED, the thin film transistor array substrate 1 of FIGS. 1 and 2 may be a thin film transistor array substrate installed in the liquid crystal display device.

Referring to FIGS. 1 and 2, the thin film transistor array substrate 1 may include a scan line S, a data line D, a power source line E, at least one of the thin film transistors dTFT and sTFT, and at least one capacitor Cap, and an organic light-emitting device OLED. The scan line S and the power source line E may be aligned to extend in the first direction (in the transverse direction of FIG. 1), and the data line D may be aligned to extend in the second direction (in the longitudinal direction of FIG. 1). The scan line S and the data line D which cross each other define a pixel region P. FIG. 1 shows a plurality of scan lines S, power source lines E, and data lines D which are respectively electrically connected to each of a plurality of pixel regions P. In the pixel region P, a thin film transistor dTFT or sTFT, a capacitor Cap, and an organic light-emitting device OLED may be disposed.

The thin film transistor dTFT and/or sTFT may include an active layer 212, a gate electrode 210, and source and drain electrodes 217b and 217a. The active layer 212 may be formed on a substrate 10 and may include a semiconductor material. The gate electrode 210 may include a lower electrode 214 and an upper electrode 215. The lower electrode 214 may be formed on the same layer as a pixel electrode 114 using the same material as a pixel electrode 114 of the organic light-emitting device OLED, which will be described later. The upper electrode 215 may be formed of a low resistant conductive material.

A first insulating layer 13 that is a gate insulating layer may be interposed between the active layer 212 and the gate electrode 210. A second insulating layer 16 that is an interlayer insulating layer may be interposed between the gate electrode 210 and the source and drain electrodes 217b and 217a. Source and drain regions 212b and 212a that are doped with high concentration impurities may be formed respectively at sides of the active layer 212, and may be respectively electrically connected to the source electrode and drain electrodes 217b and 217a via contact holes C1 and C2 through the first insulating layer 13 and the second insulating layer 16. A third insulating layer 18 may be formed on the source electrode and drain electrodes 217b and 217a. For convenience of description, only the driving thin film transistor dTFT is shown in FIG. 2. However, the switching thin film transistor sTFT may have the same cross-sectional structure as the driving thin film transistor dTFT.

The scan line S and the power source line E may be formed on the same layer as the gate electrode 210 using the same material as the gate electrode 210 of the thin film transistor TFT. The scan line S and the power source line E may be simultaneously patterned during a process of forming the gate electrode 210 of the thin film transistor TFT, which will be described later. For example, the scan line S may be electrically connected to the gate electrode 210 of the switching thin film transistor sTFT and may transmit a scanning signal for turning on the switching thin film transistor sTFT. In addition, the power source line E may be electrically connected to the source electrode or drain electrodes 217b and 217a of the driving thin film transistor dTFT and may supply a first power supply voltage ELVDD that operates the organic light-emitting device OLED.

The data line D may be formed on the same layer as the source and drain electrodes 217b and 217a using the same material as the source and drain electrodes 217b and 217a of the thin film transistor TFT. The data line D may be patterned during a process of forming the source and drain electrodes 217b and 217a of the thin film transistor TFT, which will be described later. For example, the data line D may be electrically connected to source or drain electrodes of the switching thin film transistor sTFT and may transmit a data signal to the capacitor Cap.

The capacitor Cap may be electrically connected to the switching thin film transistor sTFT and may charge a signal applied to the driving thin film transistor dTFT even after the switching thin film transistor sTFT is turned off.

The organic light-emitting device OLED may be electrically connected to the driving thin film transistor dTFT to emit light and includes a pixel electrode 114, a counter electrode 119 facing the pixel electrode 114, and an intermediate layer 118 interposed between the pixel electrode 114 and the counter electrode 119. The pixel electrode 114 may be formed on the same layer as the lower electrode 214 of the gate electrode 210. If the organic light-emitting device OLED is a bottom emission type device that emits light toward the substrate 10, the pixel electrode 114 may be a light transmissive electrode, and the counter electrode 119 may be a light reflective electrode. In this regard, the pixel electrode 114 and the lower electrode 214 may include a transparent conductive oxide (TCO). If the organic light-emitting device OLED is a top emission type device that emits light in a direction away from the substrate 10, the pixel electrode 114 may be a light reflective electrode including a semi-transmissive metal layer, and the counter electrode 119 may be a light transmissive electrode. Alternatively, the organic light-emitting device OLED may be a dual emission type device that emits in bi-directions by combining the top and bottom emission type devices.

According to an exemplary embodiment, a repair line R may be disposed on the same layer as the active layer 212 of the thin film transistor TFT. The repair line R may be formed of a semiconductor material that is the same material as the active layer 212. As shown in FIG. 2, the repair line R may be formed on the substrate 10, the first insulating layer 13 may be interposed between the repair line R and the scan line S and power source line E to, e.g., insulate therebetween. The repair line R may be patterned during a process of forming the active layer 212 of the thin film transistor TFT, which will be described later. Thus, a separate mask process for forming the repair line R may not be needed.

The repair line R shown in FIG. 1 may be aligned in the same direction, e.g., in the first direction, as the scan line S and the power source line E (in the transverse direction of FIG. 1). The repair line R may be aligned to cross the data line D. That is, the repair line R has at least one crossing point with the data line D. At least one repair line R may be disposed in a pixel region P. One of the repair lines R may be disposed at a first side of the scan line S, and the other repair line R may be disposed at a second side, opposite to the first side, of the power source line E.

The repair line R of FIG. 1 may be used to repair the data line D when, e.g., a short-circuit is generated between the scan line S and the data line D, or between the power source line E and the data line D.

Figure 3A:
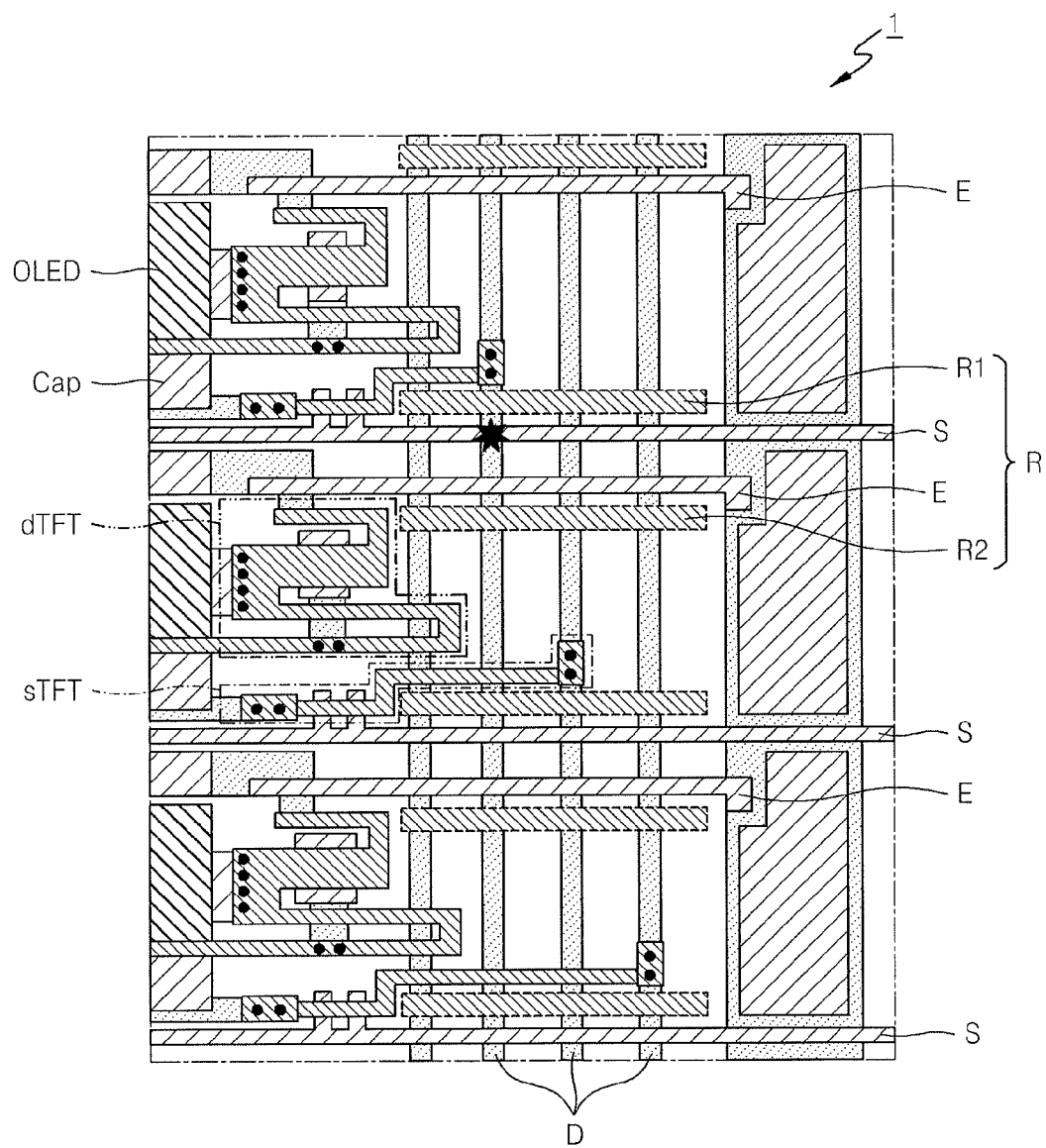
FIG. 3A illustrates a schematic bottom view of the thin film transistor array substrate of FIG. 1 having a defect.
Figure 3B:
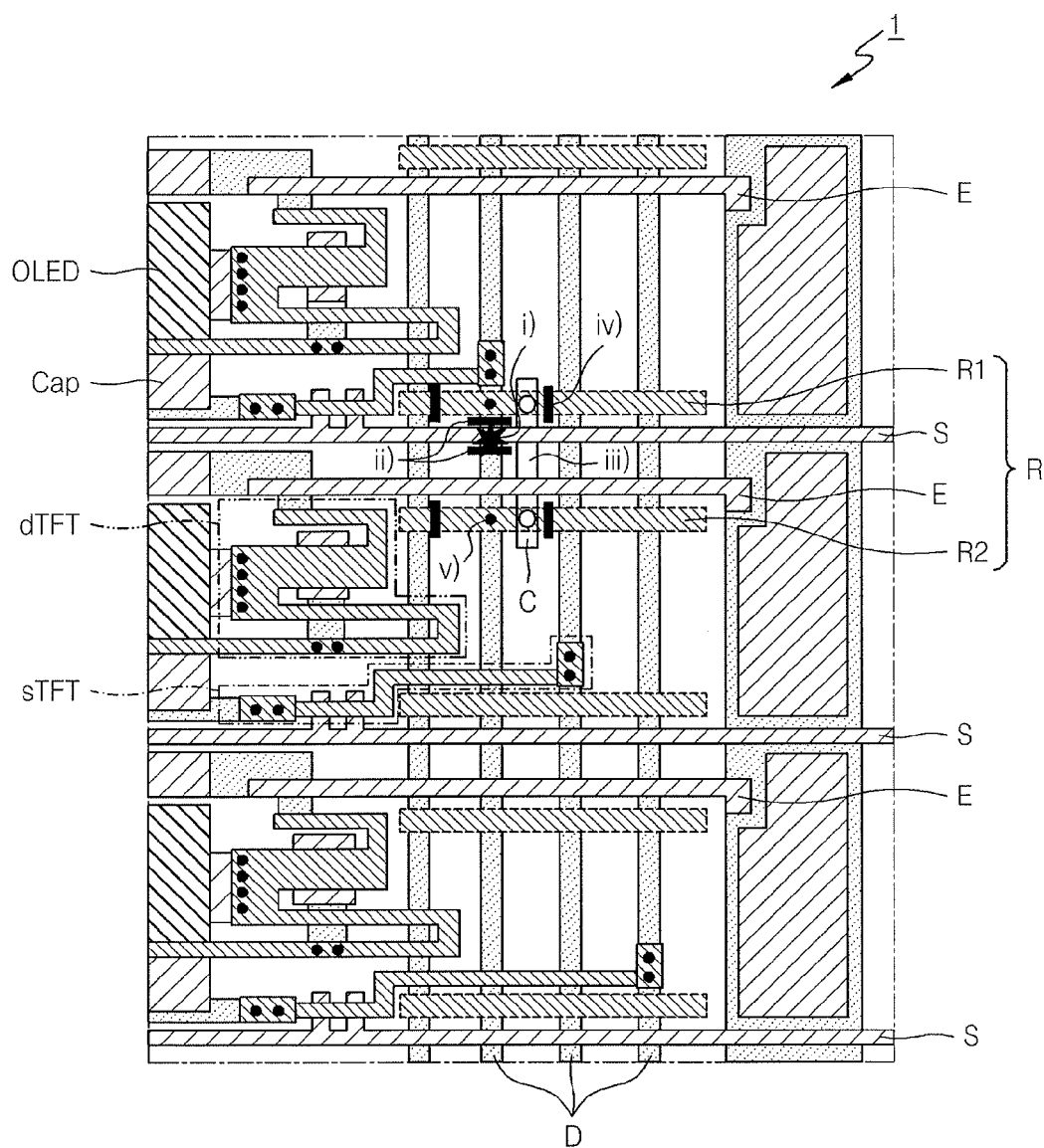
FIG. 3B illustrates a schematic bottom view of the thin film transistor array substrate of FIG. 3A depicting an exemplary repairing process of the defect.

FIG. 3A illustrates a schematic bottom view of the thin film transistor array substrate of FIG. 1 having a defect, and FIG. 3B illustrates a schematic bottom view of the thin film transistor array substrate of FIG. 3A showing a repairing process of the defect. That is, FIGS. 3A and 3B show the bottom surface of the substrate through which devices formed on the front surface of the substrate are shown.

Referring to FIG. 3A, a short-circuit may be generated at a crossing point of the data line D and the scan line S during the process of manufacturing the thin film transistor array substrate 1. However, embodiments are not limited thereto, e.g., a short-circuit may also be generated at a crossing point of the data line D and the power source line E.

Referring to FIG. 3B, the short-circuit may be repaired by a process including, e.g., i) confirming a crossing point where a short-circuit occurs, ii) disconnecting the crossing point by cutting the data line D near the crossing point using a laser beam, iii) disposing a conductive cross stick C such that a pair of repair lines R1 and R2 near the crossing point are electrically connected to each other and welding overlap portions of the repair lines R1 and R2 and the cross stick C, iv) cutting unnecessary portions of the repair lines R1 and R2, and v) electrically connecting two ends of the data line D disconnected from the crossing point to the repair lines R1 and R2. In this regard, the unnecessary portions refer to portions of the repair line R which may overlap another data line D where the short-circuit is not generated. The possibility of signal interference, which may occur at overlap portions of another data line D and the repair line R, may be reduced and/or prevented by cutting the unnecessary portions of the repair line R. Accordingly, a data signal from one end of the data line D may pass sequentially through the repair line R1 disposed at a first side of the scan line S, the cross stick C, and the repair line R2 disposed at a second side, opposite to the first side, of the power source line E to arrive at the other end of data line D.

According to an exemplary embodiment, when the short-circuit between the scan line S and the data line D or between the power source line E and the data line D is repaired, a repair line R disposed on a different layer from a layer on which the short-circuited lines are disposed may be used. In this regard, the different layer refers to a layer formed by using a different process, or on a different insulating layer. If the repair line R is disposed on the same layer as the short-circuited lines, space for the repair line R may not be needed and/or required, and thereby reducing an aperture ratio. In a thin film transistor array substrate 1 including a bottom emission type organic light-emitting device OLED, the organic light-emitting device OLED cannot be overlapped with another device including wires, and thus the aperture ratio may be reduced. Thus, there is a need for a design of aligning the repair line R to prevent the decrease in the aperture ratio. Thus, when the repair line R is aligned on the same layer as the active layer 212 of the thin film transistor TF, according to an exemplary embodiment, short-circuits between wires may be efficiently repaired without performing a separate mask process and the decrease in the aperture ratio may be prevented.

FIGS. 4 through 7B illustrate schematic cross-sectional views for describing a method of manufacturing the thin film transistor array substrate 1 of FIGS. 1 and 2. Mask processes, which will be described below, include a series of stages that may include coating of a photoresist, masking, exposing, etching, and delaminating.

Figure 4:
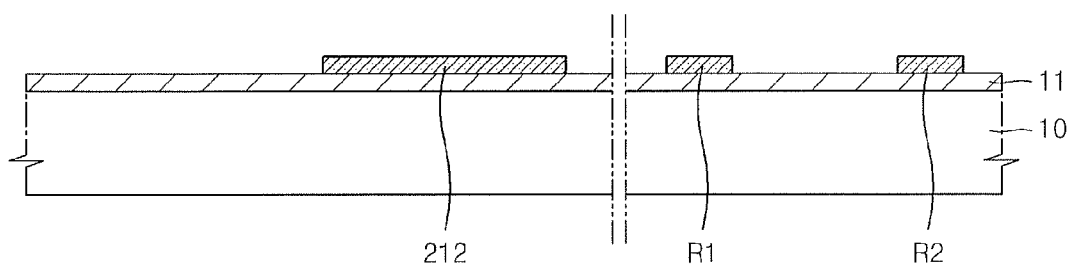
FIGS. 4 through 7B illustrate schematic cross-sectional views for describing a method of manufacturing the thin film transistor array substrate of FIGS. 1 and 2.

First, as shown in FIG. 4, an auxiliary layer 11 may be formed on the substrate 10. The substrate 10 may be a transparent substrate such as a glass substrate or a plastic substrate including polyethylene terephthalate (PET), polyethylene naphthalate (PEN), polyimide, and/or the like.

The auxiliary layer 11 may be formed on the substrate 10. The auxiliary layer 11, such as a barrier layer, a blocking layer, and/or a buffer layer, may reduce the possibility of and/or prevent impurity ions from diffusing into the substrate 10, may reduce the possibility of and/or prevent moisture or external air from penetrating into the substrate 10, and may planarize a surface of the substrate 10. The auxiliary layer 11 may have a single or multi-layered structure formed of, e.g., $SiO_2$ and/or $SiN_x$, and may be formed by using various deposition methods, such as a plasma enhanced chemical vapor deposition (PECVD), an atmospheric pressure CVD (APCVD), and a low pressure CVD (LPCVD).

The active layer 212 and the repair line R may be formed on the auxiliary layer 11. In detail, an amorphous silicon layer (not shown) may be deposited on the auxiliary layer 11, and then crystallized to form a polycrystalline silicon layer (not shown). The amorphous silicon layer may be crystallized by using various methods, such as a rapid thermal annealing (RTA), a solid phase crystallization (SPC), an excimer laser annealing (ELA), a metal induced crystallization (MIC), a metal induced lateral crystallization (MILC), and a sequential lateral solidification (SLS). Then, the polycrystalline silicon layer may be patterned into the active layer 212 of the thin film transistor TFT and the repair line R by using a mask process using a first mask (not shown).

Figure 5A:
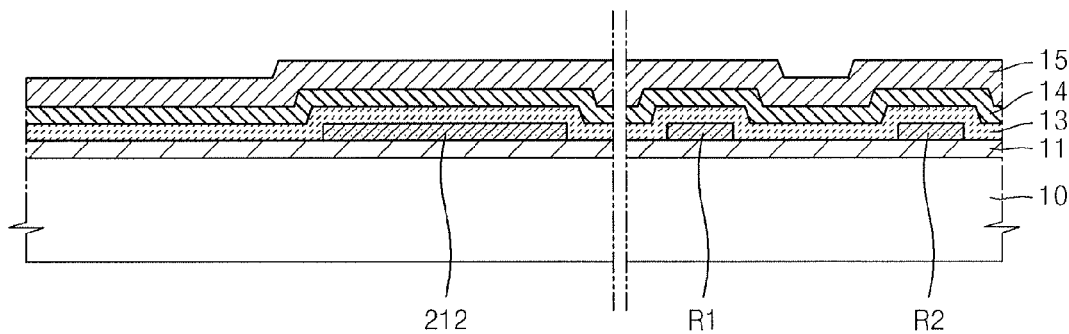

Then, as shown in FIG. 5A, the first insulating layer 13, the first conductive layer 14, and the second conductive layer 15 may be sequentially formed on the entire surface of the substrate 10 on which the active layer 212 is formed.

The first insulating layer 13 may be formed by depositing an inorganic insulating material, such as at least one of SiOx, SiON, $Al_2O_3$, $TiO_2$, $Ta_2O_5$, $HfO_2$, $ZrO_2$, Barium Strontium Titanate (BST), and Lead Zirconate Titanate (PZT), by using PECVD, APCVD, LPCVD, or the like. The first insulating layer 13 may operate as a gate insulating layer of the thin film transistor TFT between the active layer 212 and the gate electrode 210 of the thin film transistor TFT.

For example, the first conductive layer 14 may include at least one material of indium tin oxide (ITO), indium zinc oxide (IZO), zinc oxide (ZnO), indium oxide ($In_2O_3$), indium gallium oxide (IGO), and aluminum zinc oxide (AZO). The first conductive layer 14 may be patterned into the pixel electrode 114, the lower electrode 214, and the lower layers of the scan line S and the power source line E. When the organic light-emitting device OLED disposed on the thin film transistor array substrate 1 is a bottom emission type organic light-emitting device OLED that emits light toward the substrate 10, the pixel electrode 114 needs to be a transparent electrode. Thus, the first conductive layer 14 for forming the pixel electrode 114 may be formed of a transparent conducting oxide TCO.

The second conductive layer 15 may have a single or multi-layered structure including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The second conductive layer 15 may have a Mo—Al—Mo structure. The second conductive layer 15 may be patterned into the upper electrode 215, and the upper layers of the scan line S and the power source line E later.

Figure 5B:
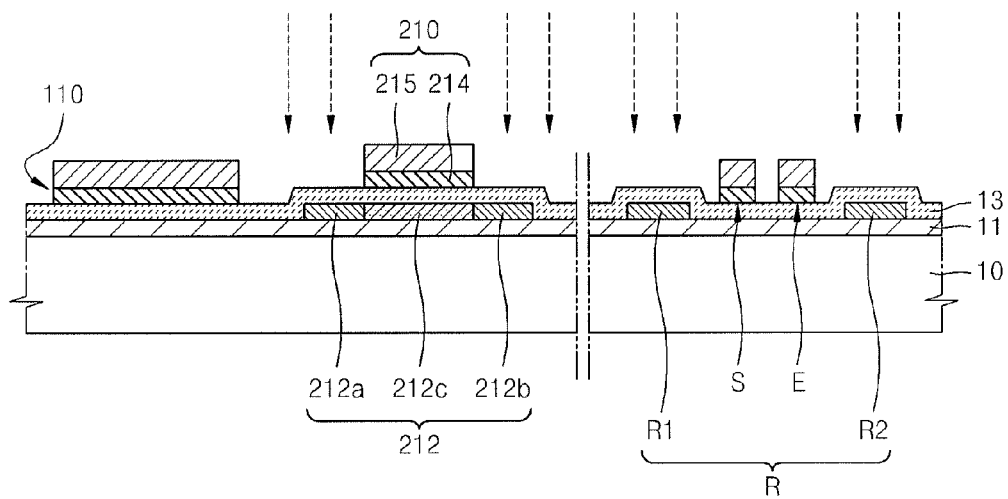

Then, as shown in FIG. 5B, a pixel electrode pattern 110, the gate electrode 210, the scan line S, and the power source line E may be formed. In detail, the first conductive layer 14 and the second conductive layer 15 formed on the entire surface of the substrate 10 may be patterned by using a mask process using a second mask (not shown).

The pixel electrode pattern 110 may be formed on an area where the organic light-emitting device OLED will be formed, and the scan line S and the power source line E may be formed on an area where the wires will be formed.

The gate electrode 210 may be formed to correspond to the center of the active layer 212. The source and drain regions 212b and 212a may be formed at sides of the active layer 212 by doping n- or p-type impurities using the gate electrode 210 as a self-align mask. The center of the active layer 212 corresponding to the gate electrode 210 will be an undoped channel region 212c. For example, the n- or p-type impurities may be boron (B) or phosphor (P) ions.

Conductivity of the repair line R may be improved by doping the n- or p-type impurities on the repair line R, e.g., so that quality of signal transmission may be improved when the repair line R transmits a signal due to a short-circuit between wires.

Figure 6A:
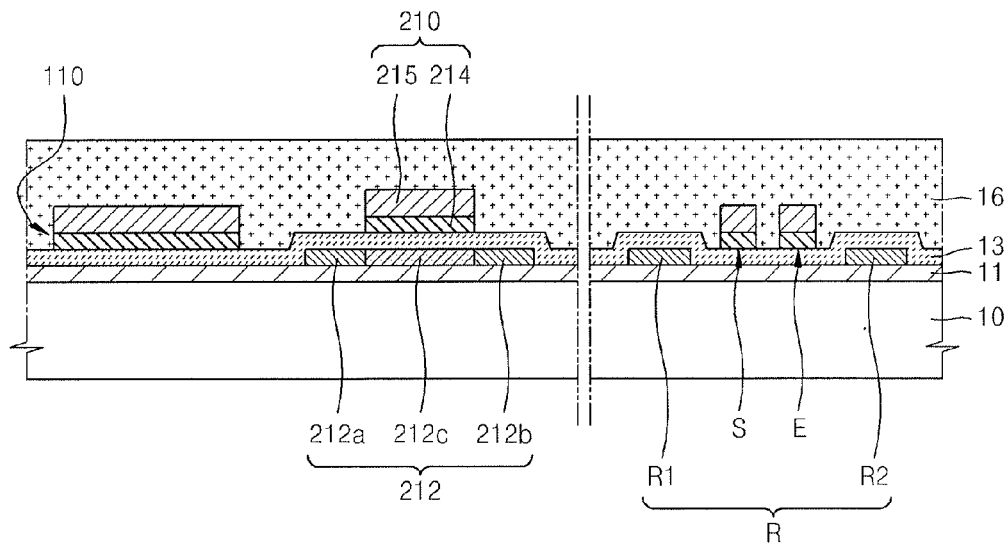

Then, as shown in FIG. 6A, the second insulating layer 16 may be formed on the resultant structure of FIG. 5B.

The second insulating layer 16 may be formed of an inorganic insulating material including at least one of $SiO_2$, $SiN_x$, SiON, $Al_2O_3$, $TiO_2$, $Ta_2O_5$, $HfO_2$, $ZrO_2$, BST, and PZT. A thickness of the second insulating layer 16 may be sufficient enough, e.g., may be thicker than a thickness of the first insulating layer 13, to perform functions as an interlayer insulating layer between the gate electrode 210 and the source and drain electrodes 217b and 217a. The second insulating layer 16 may be formed of not only the inorganic insulating material stated above, but also an organic insulating material, or may be formed by alternately stacking an organic insulating material and an inorganic insulating material.

Figure 6B:
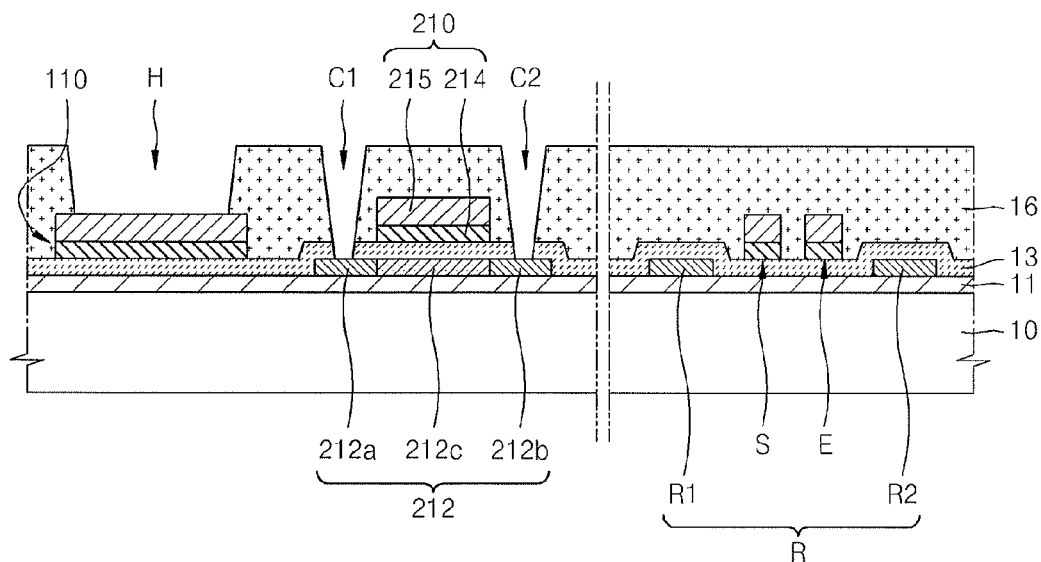

Then, as shown in FIG. 6B, the first insulating layer 13 and/or the second insulating layer 16 may be patterned to form contact holes C1 and C2 and an opening H. In detail, the first insulating layer 13 and/or the second insulating layer 16 may be patterned by using a mask process using a third mask (not shown).

Here, the contact holes C1 and C2 may be formed to expose portions of the source and drain regions 212b and 212a of the active layer 212. The opening H may be formed to partially expose the pixel electrode pattern 110. The second insulating layer 16 corresponding to the area where wires are formed may insulate between the data line D of the upper portion and the repair line R, the power source line E, and the scan line S of the lower portion. If the second insulating layer 16 corresponding to the area where the wires are formed does not have a sufficient thickness or is not uniformly formed, a short-circuit may be generated between the wires as shown in FIG. 3A.

Figure 7A:
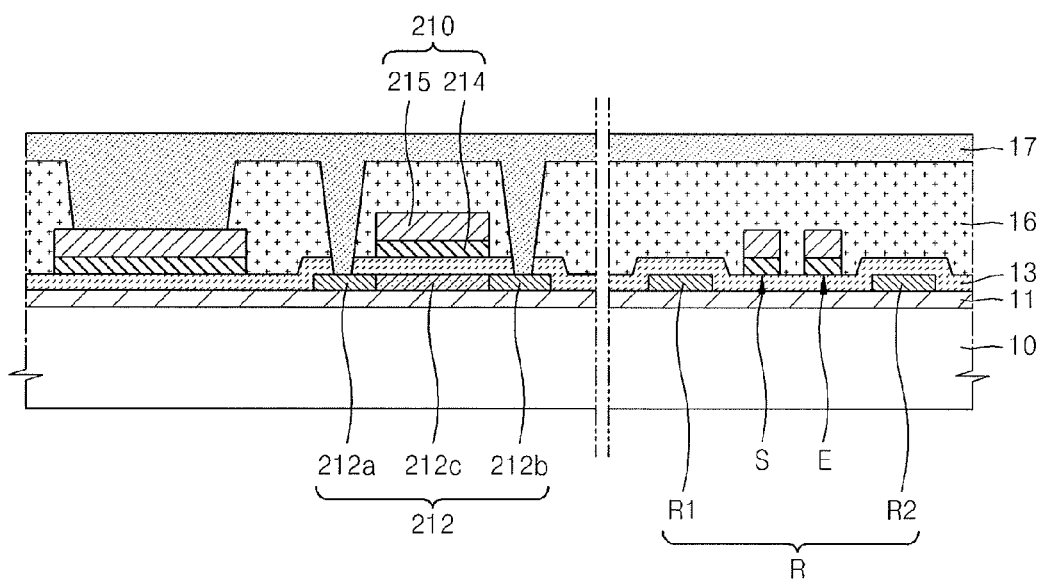

Then, as shown in FIG. 7A, a third conductive layer 17 may be formed on the entire surface of the substrate 10 to cover the second insulating layer 16. The third conductive layer 17 may be formed of the same material as the second conductive layer 15 stated above. However, embodiments are not limited thereto, e.g., the third conductive layer 17 may also be formed of various conductive materials. The conductive material may be deposited to have a thickness sufficient to fill the contact holes C1 and C2 and the opening H.

Figure 7B:
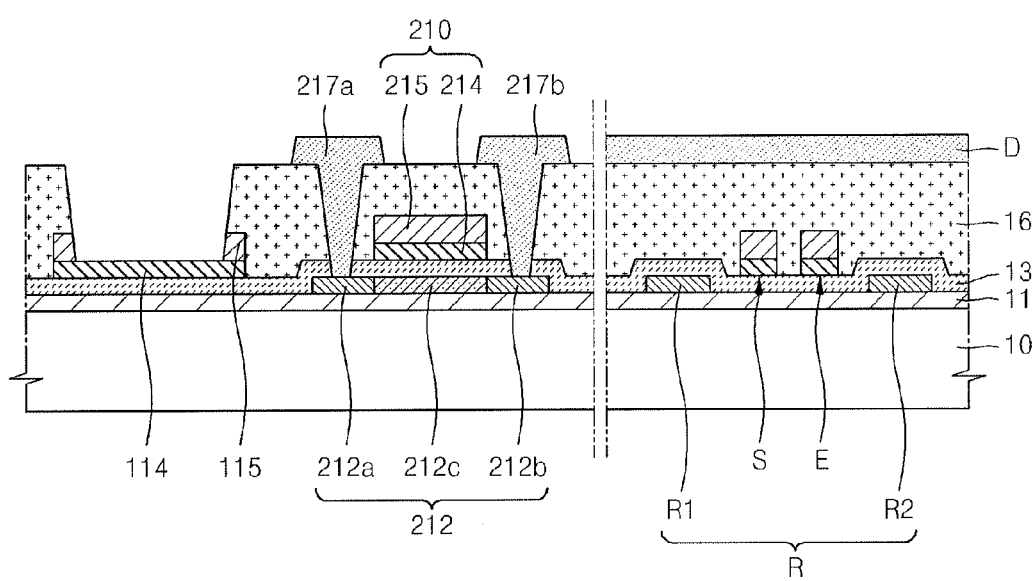

Then, as shown in FIG. 7B, the source and drain electrodes 217b and 217a and the data line D may be formed, and the second conductive layer 115 formed on the pixel electrode pattern 110 may be removed to form the pixel electrode 114. In detail, the third conductive layer 17 may be patterned by using a mask process using a fourth mask (not shown). In this regard, the source electrode 217b may be electrically connected to the source region 212b via the contact hole C2, and the drain electrode 217a may be electrically connected to the drain region 212a via the contact hole C1.

If the third conductive layer 17 forming the source and drain electrodes 217b and 217a is the same material as the second conductive layer 115 forming the pixel electrode pattern 110, the source and drain electrodes 217b and 217a may be formed simultaneously with the pixel electrode 114. However, if the third conductive layer 17 and the second conductive layer 15 are formed of different materials, the pixel electrode 114 may be formed by performing a further etching after forming the source and drain electrodes 217b and 217a. In detail, the pixel electrode 114 may be formed by removing the second conductive layer 115 formed on the pixel electrode pattern 110 exposed by the opening H.

If the second insulating layer 16 corresponding to the area where the wires are formed does not have a sufficient thickness or is not uniformly formed, a short-circuit may be generated between the data line D and the scan line S or the power source line E.

Then, although not shown herein, a pixel defining layer 18 (FIG. 2) having an opening that exposes the pixel electrode 114 may be formed on the substrate 10, and an intermediate layer 118 (FIG. 2) including an organic light-emitting layer may be formed on the pixel electrode 114. Finally, the counter electrode 119 (FIG. 2) may be deposited on the surface, e.g., entire surface, of the substrate 10 as a common electrode, and thereby manufacturing the thin film transistor array substrate 1 including the organic light-emitting device OLED.

Figure 8:
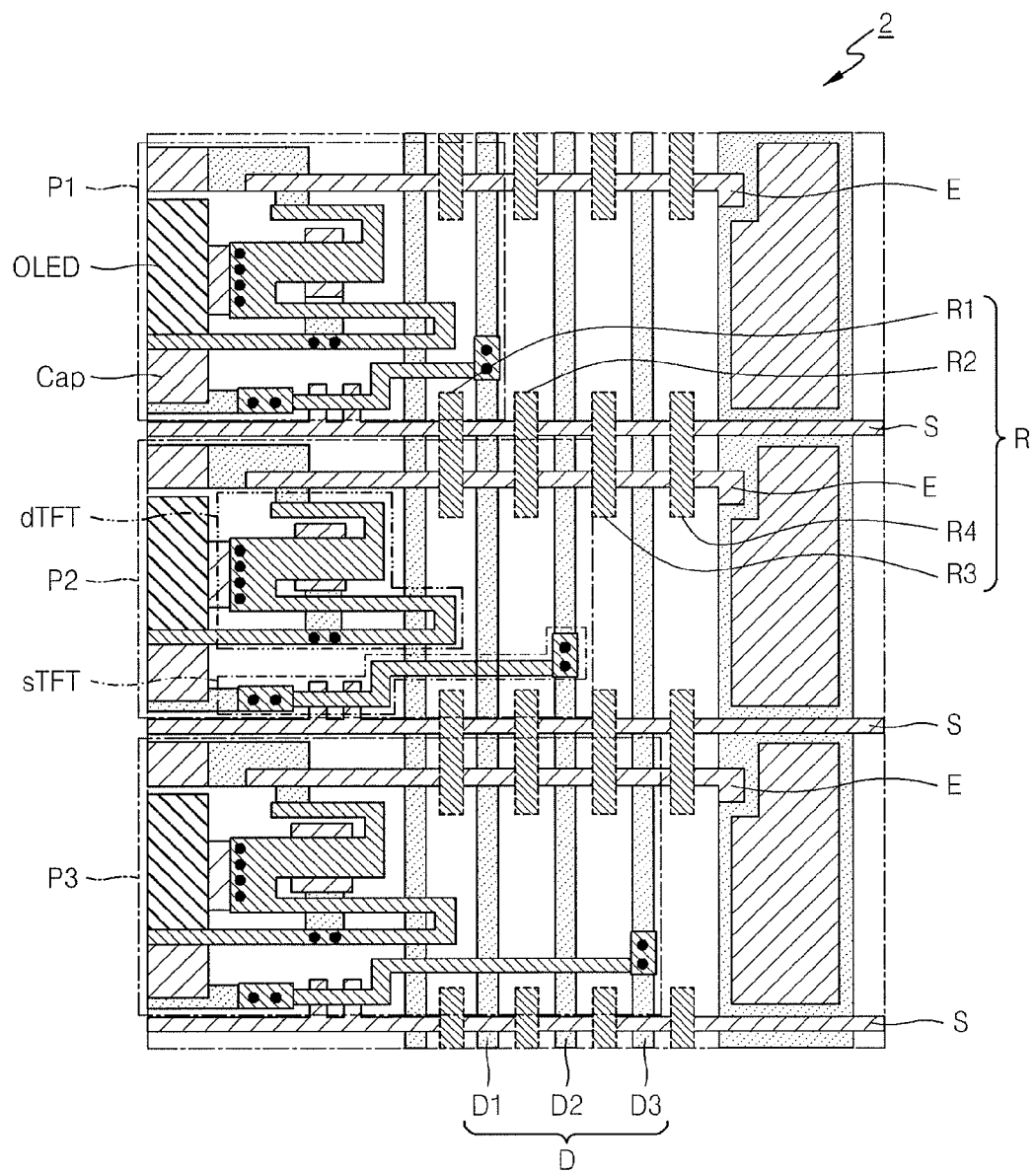
FIG. 8 illustrates a schematic bottom view of a thin film transistor array substrate, according to an exemplary embodiment.
Figure 9A:
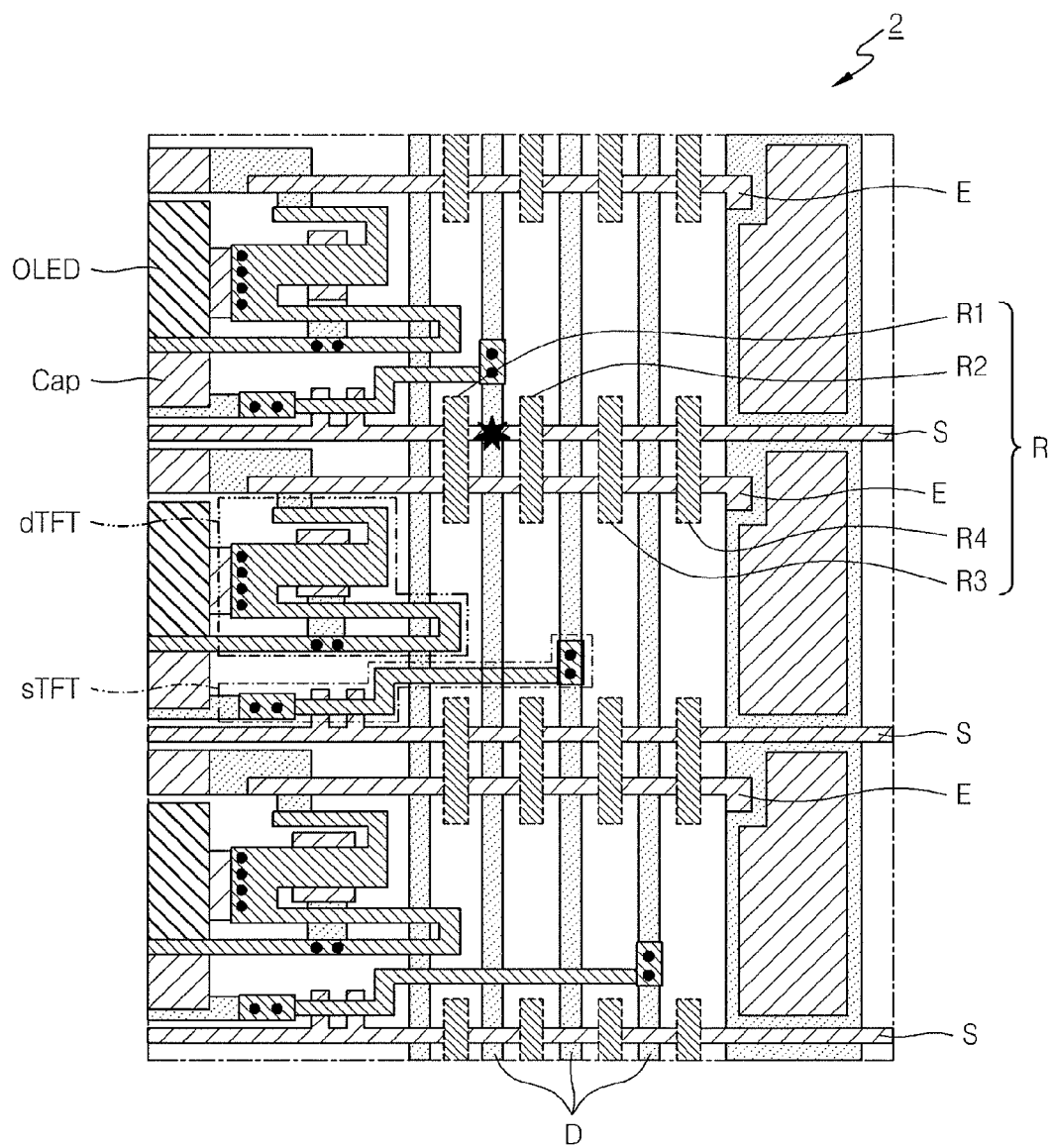
FIG. 9A illustrates a schematic bottom view of the thin film transistor array substrate of FIG. 8 having a defect.
Figure 9B:
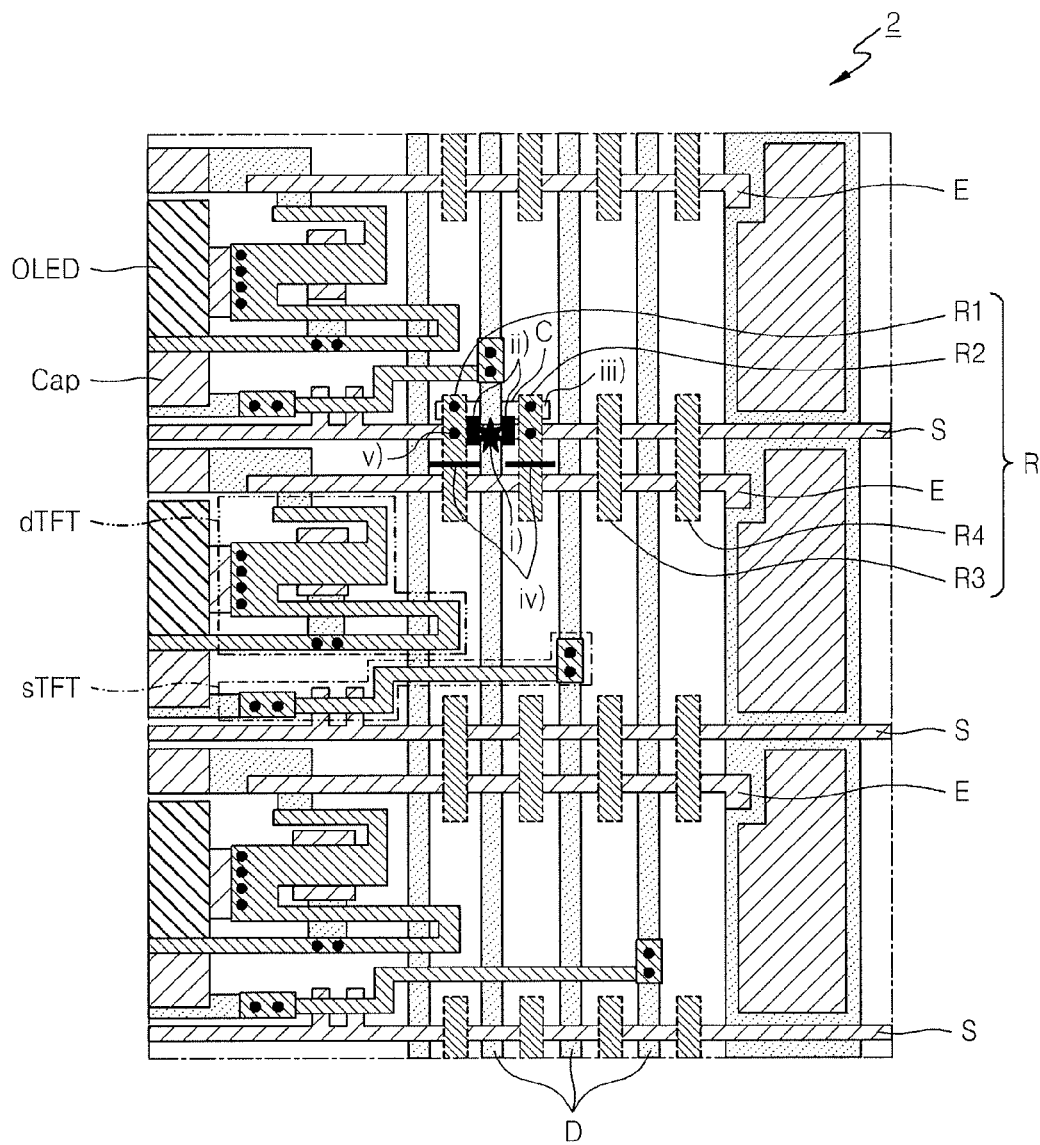
FIG. 9B illustrates a schematic bottom view of the thin film transistor array substrate of FIG. 9A depicting an exemplary repairing process of the defect.

FIG. 8 illustrates a schematic bottom view of a thin film transistor array substrate 2 according to another exemplary embodiment. FIG. 9A illustrates a schematic bottom view of the thin film transistor array substrate 2 of FIG. 8 having a defect, and FIG. 9B illustrates a schematic bottom view of the thin film transistor array substrate 2 of FIG. 9A showing an exemplary repairing process of the defect. That is, FIGS. 8 through 9B show the bottom surface of the substrate through which devices formed on the front surface of the substrate are shown.

The thin film transistor array substrate 2 shown in FIG. 8, according to an exemplary embodiment, has a different alignment from the thin film transistor array substrate 1 shown in FIG. 1. The other elements of the current exemplary embodiment that correspond to those according to the previous exemplary embodiment are the same in terms of constitutions and operations thereof, and thus a detailed description there of is omitted.

Referring to FIG. 8, the repair line R may be disposed on the same layer as the active layer 212 of the thin film transistor TFT and may be formed of the same material, e.g., the semiconductor material, as the active layer 212. Thus, a separate mask process for forming the repair line R may not be needed.

The repair line R shown in FIG. 8 may be aligned in the same direction, e.g., in the second direction, as the data line D (in the longitudinal direction of FIG. 8). In addition, the repair line R may be aligned to cross the scan line S and the power source line E. That is, the repair line R may have at least one crossing point with the scan line S and the power source line E. At least one repair line R may be disposed over adjacent pixel regions P to be substantially parallel to the data lines D. If there are a plurality of data lines D1, D2, and D3 respectively providing different data signals to pixel regions P1, P2, and P3, a plurality of repair lines R1, R2, R3, and R4 may be disposed at one side of each of the data lines D1, D2, and D3.

For example, in FIG. 8, a first data line D1 may be electrically coupled to a first pixel region P1, a second data line D2 may be electrically coupled to a second pixel region P2, and a third data line D3 may be electrically coupled to a third pixel region P3. In this regard, a first repair line R1 may be disposed at a first side of the first data line D1, a second repair line R2 may be disposed between the first data line D1 and the second data line D2, a third repair line R3 may be disposed between the second data line D2 and the third data line D3, and a fourth repair line R4 may be disposed at a second side, opposite to the first side, of the third data line D3.

The repair line R of FIG. 8 may be used to repair the scan line S or the power source line E when a short-circuit is generated between the scan line S and the data line D, or between the power source line E and the data line D.

Referring to FIG. 9A, a short-circuit may be generated at a crossing point of the data line D and the scan line S during, e.g., the process of manufacturing the thin film transistor array substrate 2. However, embodiments are not limited thereto, e.g., a short-circuit may also be generated at a crossing point of the data line D and the power source line E.

Referring to FIG. 9B, the short-circuit may be repaired by a process including, e.g., i) confirming a crossing point where a short-circuit occurs, ii) disconnecting the crossing point by cutting the scan line S near the crossing point using a laser beam, iii) disposing a conductive cross stick C such that a pair of repair lines R1 and R2 near the crossing point are electrically connected to each other and welding overlap portions of the repair lines R1 and R2 and the cross stick C, iv) cutting unnecessary portions of the repair lines R1 and R2, and v) electrically connecting two ends of the scan line S disconnected from the crossing point to the repair lines R1 and R2. In this regard, the unnecessary portions refer to portions of the repair lines R1 and R2 that may overlap the power source line E. The possibility of signal interference, which may occur at overlap portions of the power source line E and the repair lines R1 and R2, may be reduced and/or prevented by cutting the unnecessary portions of the repair lines R1 and R2. Accordingly, a scanning signal from one end of the scan line S may pass sequentially through the repair line R1 disposed at the first side of the data line D1, the cross stick C, and the repair line R2 disposed at the second side, opposite to the first side, of the data line D to arrive at the other end of scan line S.

According to the current embodiment, when the short-circuit between the scan line S and the data line D or between the power source line E and the data line D is repaired, a repair line R disposed on a different layer from a layer on which the short-circuits lines are disposed may be used. Thus, when the repair line R is aligned on the same layer as the active layer 212 of the thin film transistor TFT, according to the current exemplary embodiment, short-circuits between wires may be efficiently repaired without performing a separate mask process and the decrease in the aperture ratio may be prevented.

Figure 10:
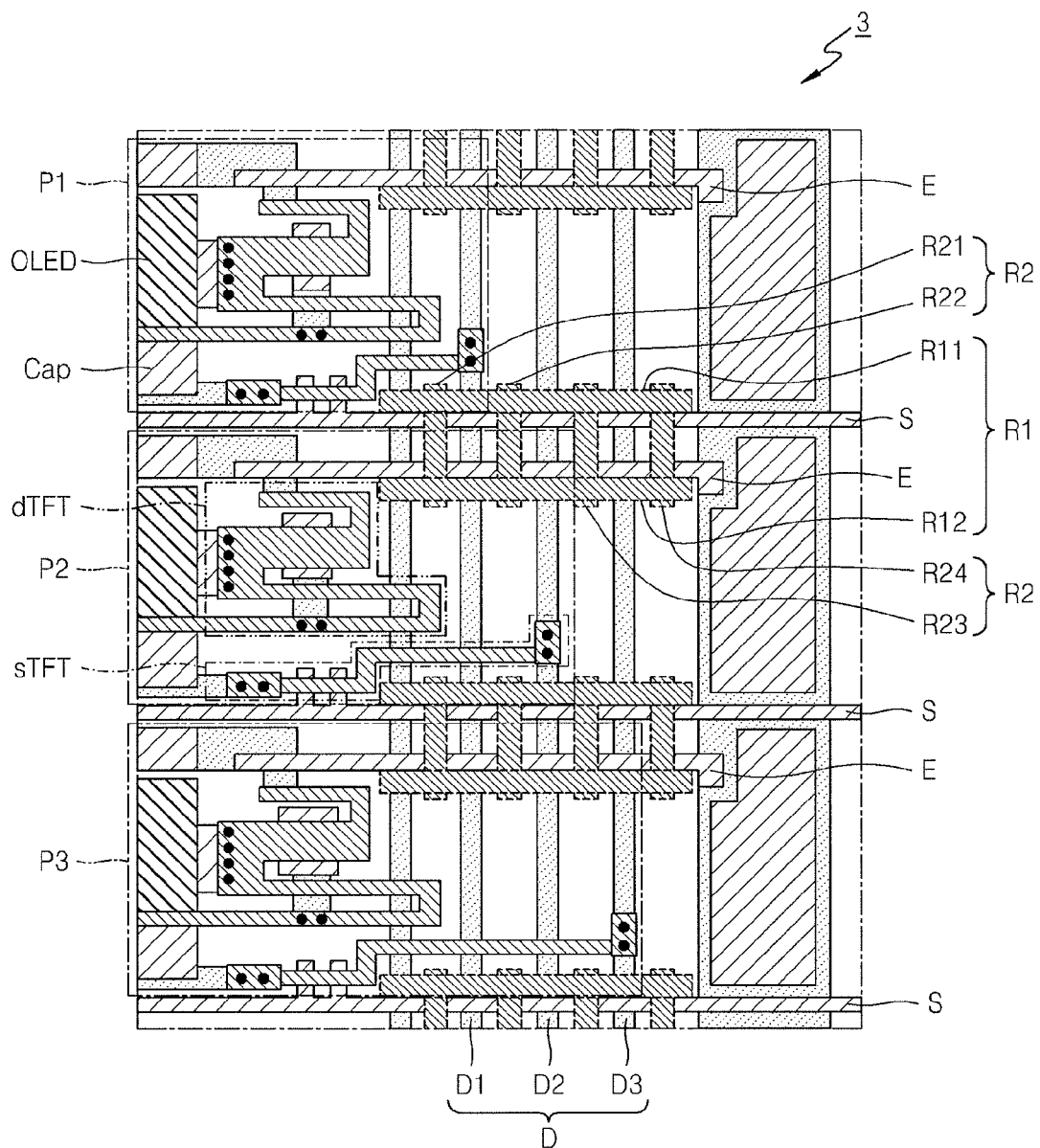
FIG. 10 illustrates a schematic bottom view of a thin film transistor array substrate according to an exemplary embodiment.
Figure 11A:
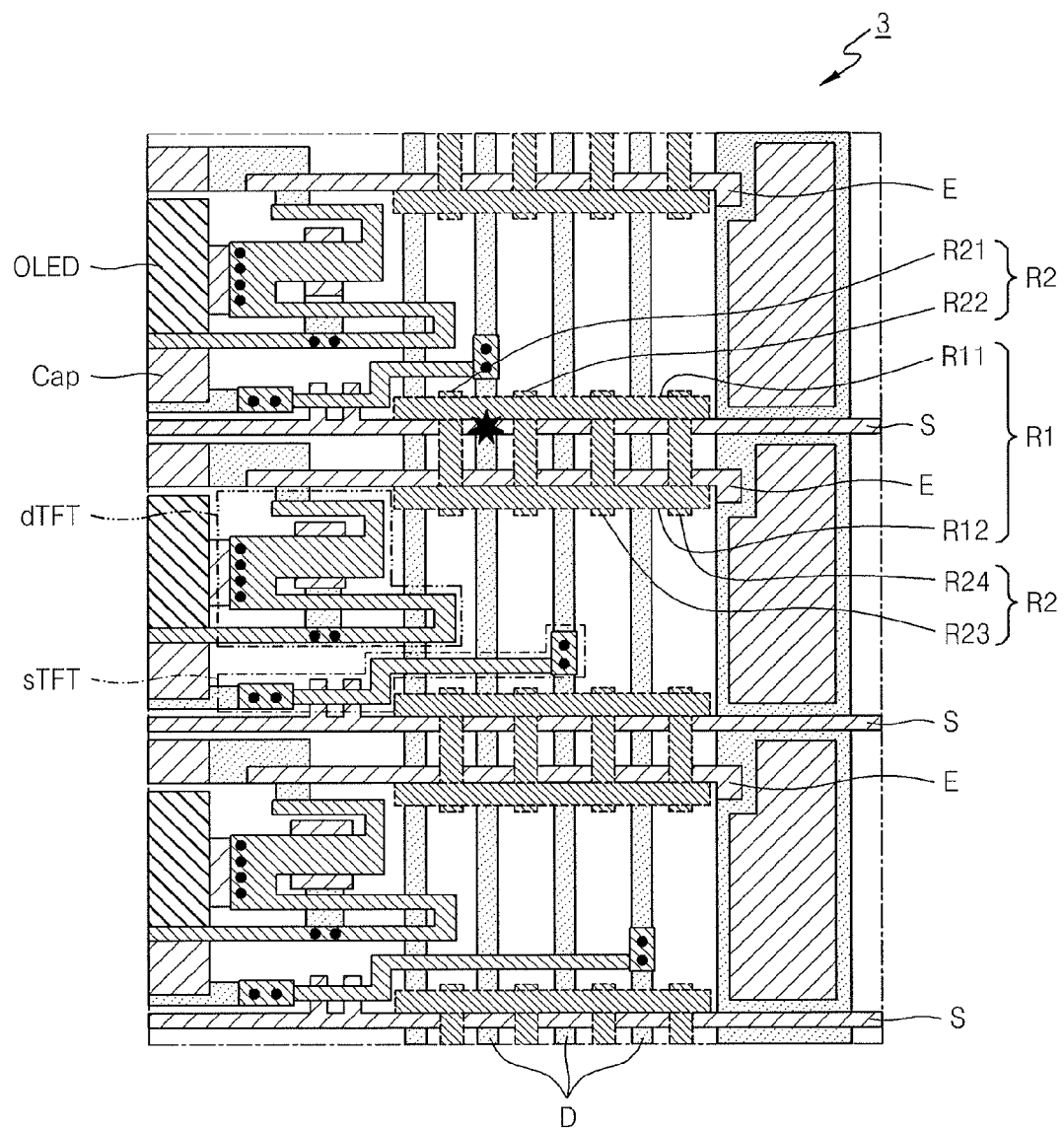
FIG. 11A illustrates a schematic bottom view of the thin film transistor array substrate of FIG. 10 having a defect.
Figure 11B:
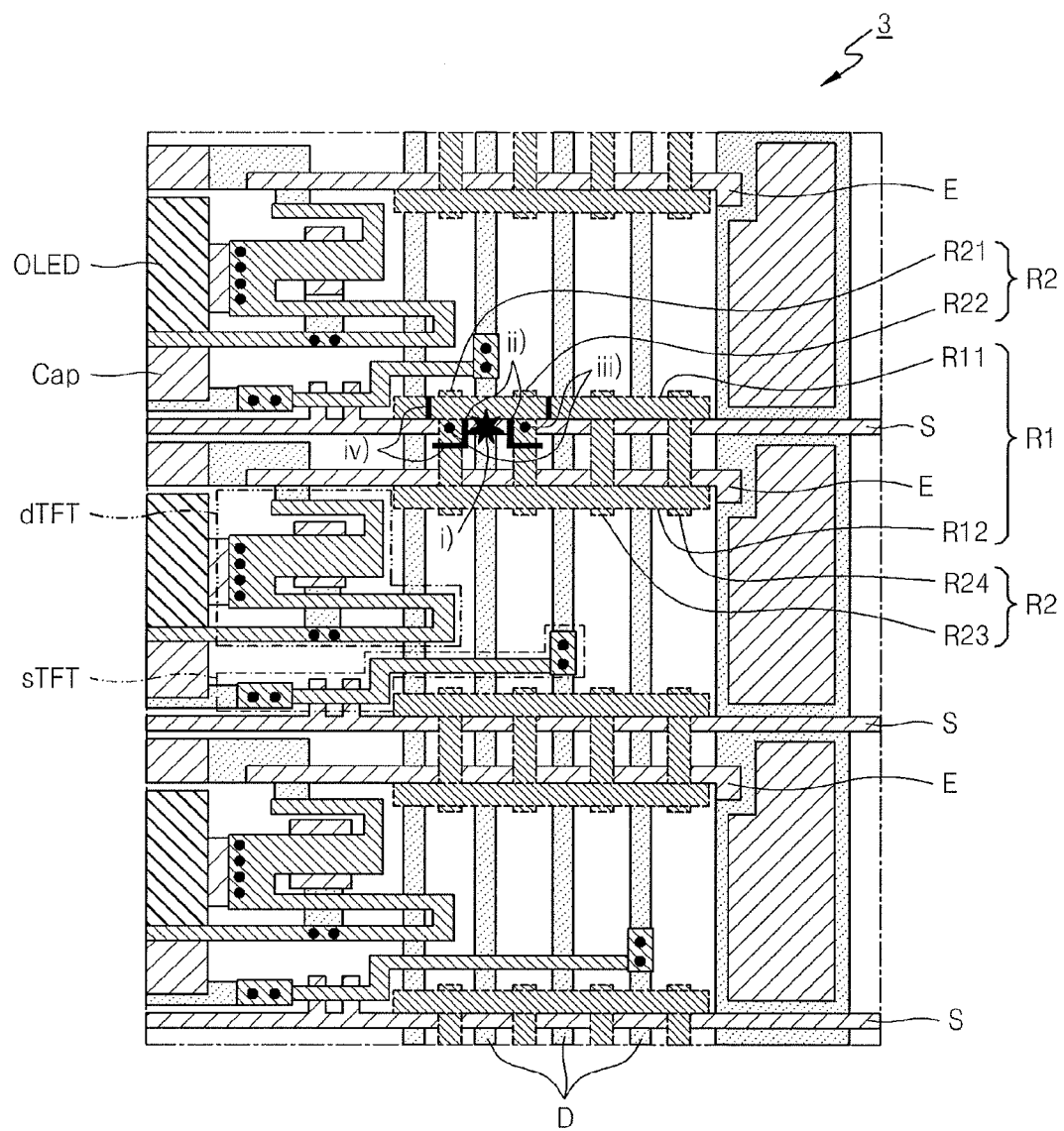
FIG. 11B illustrates a schematic bottom view of the thin film transistor array substrate of FIG. 11A depicting an exemplary repairing process of the defect.

FIG. 10 illustrates a schematic bottom view of a thin film transistor array substrate 3 according to another exemplary embodiment. FIG. 11A illustrates a schematic bottom view of the thin film transistor array substrate 3 of FIG. 10 having a defect, and FIG. 11B illustrates a schematic bottom view of the thin film transistor array substrate 3 of FIG. 11A showing an exemplary repairing process of the defect. That is, FIGS. 10 through 11B show the bottom surface of the substrate through which devices formed on the front surface of the substrate are shown.

The thin film transistor array substrate 3 shown in FIG. 10, according to the exemplary embodiment, may have a different alignment from the thin film transistor array substrate 1 shown in FIG. 1. The other elements of the exemplary embodiment that correspond to those according to the previous exemplary embodiments are the same in terms of constitutions and operations thereof, and thus a detailed description thereof is omitted.

Referring to FIG. 10, the repair line R may be disposed on the same layer as the active layer 212 of the thin film transistor TFT and may be formed of the same material, e.g., the semiconductor material, as the active layer 212. Thus, a separate mask process for forming the repair line R may not be needed.

The repair line R shown in FIG. 10 includes a first repair line R1 and a second repair line R2. The first repair line R1 may have at least one crossing point with the second repair line R2.

The first repair line R1 may be aligned in the same direction, e.g., in the first direction, as the scan line S and the power source line E (in the transverse direction of FIG. 10). In addition, the first repair line R1 may be aligned to cross the data line D. At least one first repair line R1 may be disposed in a pixel region P. One of the first repair lines R1 may be disposed at a first side of the scan line S, and the other may be disposed at a second side, opposite to the first side, of the power source line E.

The second repair line R2 may be aligned in the same direction, e.g., in the second direction, as the data line D (in the longitudinal direction of FIG. 10). In addition, the repair line R2 may be aligned to cross the scan line S and the power source line E. At least one second repair line R2 may be disposed over adjacent pixel regions P1, P2, and P3 to be substantially parallel to the data line D. If there are a plurality of data lines D1, D2, and D3 respectively providing different data signals to pixel regions P1, P2, and P3, a plurality of second repair lines R2 may be disposed at one side of each of the data lines D1, D2, and D3.

The first repair line R1 and the second repair line R2 of FIG. 10 may be used to repair the data line D, the scan line S, or the power source line E when a short-circuit is generated between the scan line S and the data line D, or between the power source line E and the data line D.

Referring to FIG. 11A, a short-circuit may be generated at a crossing point of the data line D and the scan line S during, e.g., the process of manufacturing the thin film transistor array substrate 3. However, embodiments are not limited thereto, e.g., a short-circuit may also be generated at a crossing point of the data line D and the power source line E.

Referring to FIG. 11B, the short-circuit may be repaired by a process including, e.g., i) confirming a crossing point where a short-circuit occurs, ii) disconnecting the crossing point by cutting the scan line S near the crossing point using a laser beam, iii) welding overlap portions of a pair of second repair lines R21 and R22 and the scan line S near the crossing point such that the pair of second repair lines R21 and R22 and the scan line S are electrically connected to each other, and iv) cutting unnecessary portions of the second repair lines R21 and R22.

According to the exemplary embodiment shown in FIG. 11B, a separate cross stick may not be needed and/or required. In this regard, the unnecessary portions refer to portions of the second repair lines R21 and R22 that may overlap the power source line E. In addition, the unnecessary portions of the first repair lines R11 and R12 refer to portions of the first repair lines R11 and R12 that may overlap second repair lines R23 and R24 of another region that are not used to repair the crossing point. Accordingly, a scanning signal from one end of the scan line S may pass sequentially through the second repair line R21 disposed at the first side of the data line DE the first repair line R11, and the second repair line R22 disposed at the second side, opposite to the first side, of the data line D to arrive at the other end of scan line S.

According to an exemplary embodiment, when the short-circuit between the scan line S and the data line D or between the power source line E and the data line D is repaired, a repair line R disposed on a different layer from a layer on which the short-circuits lines are disposed may be used. Thus, when the repair line R is aligned on the same layer as the active layer 212 of the thin film transistor TFT, short-circuits between wires may be efficiently repaired without performing a separate mask process and the decrease in the aperture ratio may be prevented.

Although a predetermined number of thin film transistors and capacitors are illustrated in the drawings, the drawings are only for convenience of description and the embodiments may include, e.g., a plurality of thin film transistors and a plurality of capacitors as long as the number of mask processes according to embodiments is not increased.

By way of summation and review, a flat panel display device may include wires connecting a thin film transistor and a capacitor therein. The wires may be disposed on different layers according to the connection relationship between the thin film transistor and the capacitor. The wires may overlap with each other in a predetermined region. In regions where the wires are in an overlapping relationship with each other, a short-circuit may be generated between upper and lower wires. In forty (40) inch flat panel display devices or larger devices, it may not be economical to regard a short-circuit generated between wires as a defect of the entire flat panel display device. Thus, research into repairing a short-circuit generated between the wires is being conducted.

Embodiments, e.g., the exemplary embodiments discussed above, relate to a thin film transistor array substrate, and a method of manufacturing the same, including a repair line disposed on a different layer from a layer on which wires often causing a short-circuit are disposed. Embodiments provide the repair line on a different layer from a layer on which wires often causing a short-circuit are disposed so as not to, e.g., reduce an aperture ratio. In addition, the repair line may be manufactured without performing an additional mask process by disposing the repair line on the same layer on which the active layer of the thin film transistor is disposed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin film transistor array substrate, comprising:
   a thin film transistor in a pixel region on a substrate, the thin film transistor including an active layer, a gate electrode having a lower electrode and an upper electrode, source and drain electrodes, a first insulating layer interposed between the active layer and the gate electrode, and a second insulating layer interposed between the gate electrode and the source and drain electrodes;
   a first line and a second line on a same layer as the gate electrode, the first line and the second line including a same material as the gate electrode and being aligned in a first direction;
   a third line crosses the first line to define a pixel region, the third line being on a same layer as the source and drain electrodes, including a same material as the source and drain electrodes, and being aligned in a second direction;
   a repair line on a same layer as the active layer, the repair line including a same material as the active layer; and
   a pixel electrode in the pixel region, the pixel electrode being on a same layer as the lower electrode and including a same material as the lower electrode.

2. The thin film transistor array substrate of claim 1, wherein the repair line is aligned in the first direction and has at least one crossing point with the third line.

3. The thin film transistor array substrate of claim 2, wherein the repair line is one of a plurality of repair lines, at least one of the repair lines being at a first side of the first line in the pixel region and at least one other of the repair lines being at a second side, opposite to the first side, of the second line in the pixel region.

4. The thin film transistor array substrate of claim 1, wherein the repair line is aligned in the second direction and has at least one crossing point with the first line and the second line.

5. The thin film transistor array substrate of claim 4, wherein:
   the third line is one of a plurality of third lines, each of the third lines being electrically coupled to a first pixel, a second pixel, or a third pixel, and
   the repair line is one of a plurality of repair lines, each of the repair lines being respectively aligned at one side of each of the third lines and substantially parallel to the third lines so as to cross two adjacent pixel regions.

6. The thin film transistor array substrate of claim 1, wherein the repair line includes:
   a first repair line that is aligned in the first direction and has at least one crossing point with the third line, and
   a second repair line that is aligned in the second direction and has at least one crossing point with the first and second lines, the first repair line and the second repair line crossing each other.

7. The thin film transistor array substrate of claim 6, wherein the first repair line is one of a plurality of first repair lines, at least one of the first repair lines being at a first side of the first line in the pixel region and at least one other of the first repair lines being at a second side, opposite to the first side, of the second line in the pixel region.

8. The thin film transistor array substrate of claim 6, wherein:

the third line is one of a plurality of third lines, each of the third lines being electrically coupled to a first pixel, a second pixel, or a third pixel, and
the repair line is one of a plurality of repair lines, each of the repair lines being respectively aligned at one side of each of the third lines and substantially parallel to the third lines so as to cross two adjacent pixel regions.

9. The thin film transistor array substrate of claim 1, wherein the active layer and the repair line include a semiconductor material.

10. The thin film transistor array substrate of claim 1, wherein the lower electrode and the pixel electrode include a transparent conductive oxide.

11. The thin film transistor array substrate of claim 10, wherein the transparent conductive oxide includes at least one of indium tin oxide, indium zinc oxide, zinc oxide, indium oxide, indium gallium oxide, and aluminum zinc oxide.

12. A method of manufacturing a thin film transistor array substrate, the method comprising:
   a first mask process including forming a semiconductor layer on a substrate and patterning the semiconductor layer to form an active layer of a thin film transistor and a repair line;
   a second mask process including forming a first insulating layer, sequentially stacking a first conductive layer and a second conductive layer on the first insulating layer, and simultaneously patterning the first conductive layer and second conductive layer to form a gate electrode of the thin film transistor, a scan line, a power source line, and a pixel electrode pattern;
   a third mask process including forming a second insulating layer and forming an opening such that the second insulating layer exposes source and drain regions of the active layer and the pixel electrode pattern to form a resultant structure of the third mask process; and
   a fourth mask process including forming a third conductive layer on the resultant structure of the third mask process and patterning the third conductive layer to form source and drain electrodes of the thin film transistor, a data line, and a pixel electrode.

13. The method of claim 12, wherein ion impurities are doped on the source and drain regions after performing the second mask process.

14. The method of claim 12, wherein the repair line is aligned in a first direction and has at least one crossing point with the data line.

15. The method of claim 14, wherein the repair line is one of a plurality of repair lines, at least one of the repair lines being at a first side of the scan line in a pixel region and at least one other of the repair lines being at a second side, opposite to the first side, of the power source line in the pixel region.

16. The method of claim 12, wherein the repair line is aligned in a second direction and has at least one crossing point with the scan line and the power source line.

17. The method of claim 16, wherein:
   the data line includes a first data line electrically coupled to a first pixel, a second data line electrically coupled to a second pixel, and a third data line electrically coupled to a third pixel, and
   the repair line is one of a plurality of repair lines, each of the repair lines being respectively aligned at one side of each of the data lines and substantially parallel to the data lines so as to cross two adjacent pixel regions.

18. The method of claim 12, wherein the repair line includes a first repair line that is aligned in a first direction and has at least one crossing point with the data line, and a second repair line that is aligned in a second direction and has at least one crossing point with the scan line and the power source line, the first repair line and the second repair line crossing each other.

19. The method of claim 18, wherein the first repair line is one of a plurality of first repair lines, at least one of the first repair lines being at a first side of the scan line in a pixel region and at least one other of the first repair lines being at a second side, opposite to the first side, of the power source line in the pixel region.

20. The method of claim 18, wherein:

the data line includes a first data line electrically coupled to a first pixel, a second data line electrically coupled to a second pixel, and a third data line electrically coupled to a third pixel, and the second repair line is one of a plurality of second repair lines, each of the second repair lines being respectively aligned at one side of each of the data lines and substantially parallel to the data lines so as to cross two adjacent pixel regions.

\* \* \* \* \*